(12) United States Patent
Xiang et al.

(10) Patent No.: US 11,509,285 B2
(45) Date of Patent: Nov. 22, 2022

(54) WIRELESS SENSOR SYSTEM FOR HARSH ENVIRONMENT

(71) Applicant: X-wave Innovations, Inc., Gaithersburg, MD (US)

(72) Inventors: Dan Xiang, Gaithersburg, MD (US); Uday Singh, Gaithersburg, MD (US)

(73) Assignee: X-Wave Innovations, Inc., Gaithersburg, MD (US)

( * ) Notice: Subject to any disclaimer, the term of this patent is extended or adjusted under 35 U.S.C. 154(b) by 648 days.

(21) Appl. No.: 16/528,579

(22) Filed: Jul. 31, 2019

(65) Prior Publication Data

US 2020/0144983 A1    May 7, 2020

Related U.S. Application Data

(60) Provisional application No. 62/766,752, filed on Nov. 5, 2018.

(51) Int. Cl.
*H03H 9/02* (2006.01)
*H03H 9/25* (2006.01)
*G01L 9/00* (2006.01)
*H03H 9/145* (2006.01)

(Continued)

(52) U.S. Cl.
CPC ....... *H03H 9/02818* (2013.01); *G01L 9/0025* (2013.01); *G01N 29/022* (2013.01); *H01L 41/1132* (2013.01); *H03H 9/02637* (2013.01); *H03H 9/02842* (2013.01); *H03H 9/145* (2013.01); *H03H 9/25* (2013.01)

(58) Field of Classification Search
CPC .......... H03H 9/02818; H03H 9/02637; H03H 9/02842; H03H 9/145; H03H 9/25; G01L 9/0025; G01N 29/022; H01L 41/1132

USPC ....................................................... 73/24.06
See application file for complete search history.

(56) References Cited

U.S. PATENT DOCUMENTS

2007/0051176 A1    3/2007  Liu
2020/0284763 A1*   9/2020  Lamothe ............ G01N 29/2468

OTHER PUBLICATIONS

TL Murphy, Thesis titled, "Ultrasonic Digital Communication System for a Steel Wall Multipath Channel: Methods and Results".

(Continued)

*Primary Examiner* — Hafizur Rahman
(74) *Attorney, Agent, or Firm* — Sheets Law PLLC; Kendal M. Sheets (57) ABSTRACT

A sensor system that combines the sensing application of surface acoustic wave (SAW) sensor and sensor signal transfer though the enclosure wall via acoustic means. The sensor system includes SAW sensor placed inside the enclosure and at least one pair of bulk acoustic wave (BAW) transducers, one mounted inside and second outside the enclosure wall, allowing the interrogation of SAW sensor from outside the enclosure. The external BAW transducer converts interrogation electrical pulse into acoustic pulse which travels though the enclosure wall to the internal BAW transducer. The internal BAW transducer converts the interrogation electrical pulse to electrical pulse and transfers it to SAW sensor. The response of the SAW transducer containing series of electric pulses is converted to the series of acoustic pulses by internal BAW transducer which propagates though enclosure wall. The external BAW transducer converts the series of acoustic pulses into series of electrical pulses and is received by the interrogation circuit for processing.

18 Claims, 4 Drawing Sheets

(51) Int. Cl.
  *G01N 29/02* (2006.01)
  *H01L 41/113* (2006.01)

(56) References Cited

OTHER PUBLICATIONS

X.F. Ang, G.G. Zhang, J. Wei, Z. Chen, C.C. Won, "Temperature and pressure dependence in thermocompression gold stud bonding", Thin Solid Films 504 (2006) 379.

D. C. Malocha, "Evolution of the SAW transducer for communication systems," IEEE Ultrasonics Symposium, 2004, Montreal, Quebec, Canada, 2004, pp. 302-310 vol. 1.

Sanna Harma, "Surface Acoustic Wave RFID Tags: Ideas, Developments, and Experiments," TKK Dissertations, Helsinki University of Technology Department of Applied Physics (2009).

Masaki Oishi, Hiromitsu Hamashima, and Jun Kondoh, "Measurement of cantilever vibration using impedance-loaded surface acoustic wave sensor", Japanese Journal of Applied Physics 55, 07KD06 (2016).

Masahide Tsukamoto, "Design of SAW Filters Having Inclined and Tapered Three-Transducer Configuration", Jpn. J. Appl. Phys. 19 1291 (1980).

Chia-Yen Lee and Gwo-Bin Lee, "Humidity Sensors: A Review", Sensor Letters vol. 3, 1-14, 2005.

Bodong Li, Omar Yassine, and Jürgen Kosel, "A Surface Acoustic Wave Passive and Wireless Sensor for Magnetic Fields, Temperature, and Humidity", IEEE Sensors Journal, vol. 15, No. 1, Jan. 2015.

JA. D'Amico, A. Palma and E. Verona, "Hydrogen Sensor Using a Palladium Coated Surface Acoustic Wave Delay-Line," 1982 Ultrasonics Symposium, San Diego, CA, USA, 1982, pp. 308-311.

Changbao Wen, Yongfeng Ju, Dong Yan, Yi Kang, Li Liu, and WanLin Li, "Study on Architecture and Performances of Dual Track SAW Device", Future Intelligent Information Systems, LNEE 86, pp. 143-149.

\* cited by examiner

WIRELESS SENSOR SYSTEM FOR HARSH ENVIRONMENT

CROSS-REFERENCE TO RELATED APPLICATIONS

This application claims priority benefits under 35 U.S.C. § 119(e) to U.S. Provisional Application No. 62/766,752 filed on Nov. 5, 2018, which is hereby incorporated by reference in its entirety.

FIELD OF INVENTION

The present invention is in the technical field of sensor(s) and sensor system(s). More particularly, the present invention is in the technical field of wireless sensor(s) and sensor system(s) for, but not limited to, hostile and inaccessible environment(s).

BACKGROUND

Conventional sensor(s) and sensor system(s) used to monitor condition of environment, such as temperature sensor, pressure transducer and the like, typically require wired, optical or magnetic connections for its sensing activity. Such sensor(s) are not operable if there is no wired access to the sensor or if the environment is enclosed with a medium though which electromagnetic and optical connections are not possible. Thus, sensing of environmental attributes such as, temperature, pressure, and the like, are difficult to achieve when establishment of wire, optical or electromagnetic connection to the sensor(s) is not possible.

Surface acoustic wave (SAW) devices (also referred to as SAW sensors) are widely used to measure various parameters, such as pressure, temperature, humidity, gas concentration, and mass, to name a few. Because SAW sensor(s) are passive, they do not require batteries and can be integrated into a data acquisition system. In SAW sensor(s), the acoustic waves propagate along the surface of the substrate. Generally, a SAW sensor has an input transducer, an output transducer and a substrate. An input electrical signal enters the input transducer, becomes an acoustic signal, and travels over the substrate surface to the output transducer, which converts the acoustic signal into an output electrical signal. In SAW sensor, the SAW propagation depends upon the external factors. Therefore, the output signal shows dependence of the factors affecting the SAW propagation. Because SAW sensors are fabricated using photolithography technique, the sensors can be made reliably with high level of precision and low cost. Furthermore, SAW sensor can be designed to incorporate multiple sensing capabilities in one unit, thereby making it an attractive choice.

In contrast to traditional sensors, such as active sensors that rely on the use of batteries or other power sources, SAW sensors are passive and can be designed to be wireless making it useful in those applications where harsh environment may prevent the present of human operator, or where presence of wire and/or power supply may be inappropriate. This problem becomes even more challenging for application in nuclear industry where conventional wireless interrogation of the sensor using radio frequency (RF) signals is not feasible because of the thick metal wall enclosing the harsh radiation environment.

SUMMARY

The present invention specially relates to the sensor system in SAW sensor inside the harsh environment is interrogated though thick metal wall via acoustic mean. These types of sensor system may find applications, but not limited to, in fast neutron reactors and spent nuclear fuel dry-storage casks where wire connection is not allowed and wireless (both electromagnetic and optical) interrogation is not possible because of the thick metal wall. This sensor system allows sensor interrogation from outside the enclosure encompassing the harsh inaccessible environment.

Because of their generic features, the improvement to these sensor systems is also relevant to other field of applications such as the instrumentation of pressurized-water reactors or indeed even high-temperature instrumentations in non-nuclear industries.

The sensor system of this invention is suitable for high temperature and radiation operation. The sensor design consists of SAW sensor connected to ultrasonic transducers which allows the interrogation of sensor through thick metal. The SAW sensor and the ultrasonic transducer are designed to have a broadband frequency response with same center frequency.

The present invention is a sensor system to measure physical attributes such as, but not limited to, temperature, pressure, relative humidity and gas concentration, for environment which are difficult to access by, either or all mean(s), wire(s), optical and electromagnetic connection(s). The sensor system embodiment includes a hybrid surface SAW sensor to be located inside the enclosure and is electrically connected to bulk acoustic wave (BAW) transducer(s), also known as ultrasonic transducer (UT), mounted inside on the wall of the enclosure. BAW transducer(s) are also mounted outside the enclosure. The interrogation of hybrid SAW sensor is achieved from outside the enclosure.

The hybrid SAW sensor in accordance with an illustrative embodiment of the present invention can include an electrode structure operatively coupled to a piezoelectric substrate, proving a mean to sense temperature, pressure, relative humidity and gas concentration within the environment. The electrode structure can include an interdigital transducer having a number of interdigitated electrodes that, when excited with a RF interrogation signal from an electrical interrogation unit, can be used to transmit a surface acoustic wave along a SAW delay lines of the sensor. The multi-element sensing capability in the present embodiment is achieved via dividing the delay line into multiple delay line for harnessing the different properties of SAW and its interaction with material. The temperature measurement is based on the time delay change for SAW propagation at different temperatures. The pressure sensing is based on impedance loading technique using pressure sensitive air capacitor. Change in pressure changes the capacitance which in turn changes the load across the SAW output IDT, thus the output of the SAW changes with pressure. The humidity sensing is based on SAW interaction with $TiO_2$ nanoparticles thin film, which changes the SAW velocity as well change the attenuation of the SAW in $TiO_2$ when humidity varies. Hydrogen gas sensing is based on impedance loading technique using palladium (Pd) thin film resistor. The resistance of the Pd changes with the presence of Hydrogen gas. The change in resistance changes the impedance and thus changes the output of the SAW signal.

In an aspect of the embodiments, the hybrid SAW sensor both the input and the output are connected to two different BAW transducers. This configuration allows sensor interrogation through, but not limited to, a thick metal enclosure wall using a pair of transducers outside the enclosure. An interrogator connected to the BAW transducer outside the enclosure excited the BAW transducer, which in turn converts the electrical signal into an acoustic signal which propagates though the metal wall. The BAW transducer connected to the SAW input receives the acoustic signal and converts it into an electrical signal and excites the hybrid SAW sensor. The response of the hybrid SAW sensor is converted to the acoustic signal by the BAW connected to the output of the sensor and BAW transducer outside the enclosure received the acoustic signal and converts it into electrical signal. Thus, the wireless sensing is achieved though acoustic mean.

BRIEF DESCRIPTION OF THE DRAWINGS

The present embodiments are better understood by reference to the following detailed description when considered in connection with the accompanying drawing, wherein.

DETAILED DESCRIPTION

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

The present invention will be described in the context of the embodiment of a sensor system notably to be used to detect and measure environment attributes such as, but not limited to, temperature, pressure, humidity and gas concentration, in enclosed spaced. The advantages of the present invention notably exist in the sensor system configuration, each unit design and constituent materials, which allow environment attributes interrogation possible from outside of the enclosure. The specific values and configurations discussed in these non-limiting examples can be varied and are cited merely to illustrate at least one embodiment and are not intended to limit the scope thereof.

Figure 1:
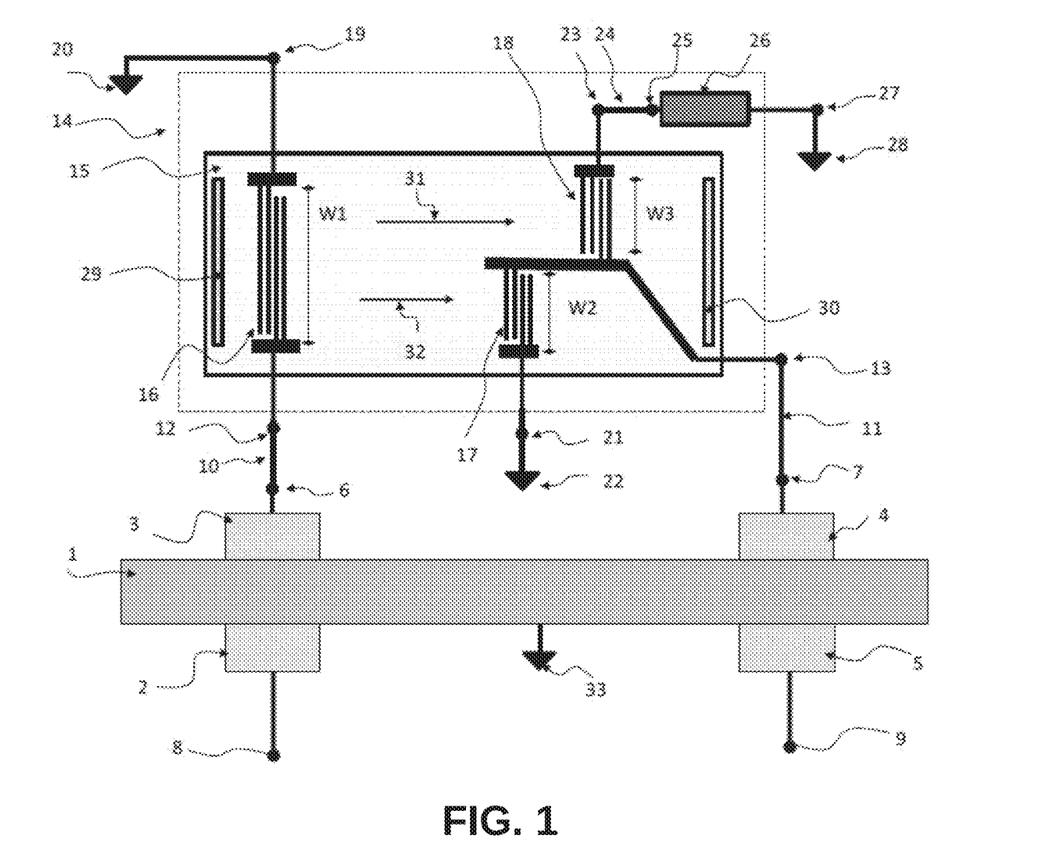
FIG. 1 is an illustration of the wireless sensor system in accordance with an aspect of an embodiment.

Referring now to the embodiment in more detail, in FIG. 1 illustrates a sensor system with hybrid SAW 14 and four BAW transducers 2, 3, 4, 5 in accordance with an aspect of an embodiment. The BAW transducers 2 and 5 are installed outside the enclosure and are on the accessible side of wall 1 of the enclosure. The BAW transducers 3 and 4 are mounted inside the enclosure and are on the inaccessible side of the wall 1. The BAW transducer 2 and 3 are positioned such that it maximizes the acoustic signal transfer from BAW transducer 2 to transducer 3 though wall 1 and vice versa. The BAW transducer 4 and 5 are positioned such that it maximizes the acoustic signal transfer from BAW transducer 4 to the BAW transducer 5 though wall 1 and vice versa. All BAW transducers 2, 3, 4, 5 are broadband frequency transducers with same center frequency. The BAW transducer 2 has one node 8 and the BAW transducer 5 has one node 9. The node 8 is electrically connected to the trigger of the interrogation circuit and node 9 is connected to the receiver end of the interrogation circuit. The wall 1 is connected to the signal ground 33 of interrogation and receiver circuit.

In further detail, still referring to FIG. 1, the two-channel hybrid SAW sensor 14, located inside the enclosure, is an assembly of SAW sensor 15 fabricated on piezoelectric substrate and sensor load 26. The piezoelectric substrate may be formed of a suitable piezoelectric material, such as, Lithium niobate, Lithium tantalate, quartz, Gallium arsenide or Aluminum nitride, whose properties can be exploited to convert electromagnetic energy into acoustic energy and vice versa via piezoelectric effect. The SAW sensor 15 consisting of three SAW interdigital transducer (IDT) 16, 17, 18 is fabricated using photolithography technique. SAW IDT fingers are normally a quarter acoustic wavelength in width at the IDT design frequency with an equal space between each alternate finger. More complex IDTs which result in improved signal characteristics use split-finger geometry, electrode apodization and dummy electrodes. The sensor load 26 is a resistance, capacitance or inductance, and it impedance change with respect to which particular parameter (temperature, pressure, relative humidity, gas concentration, etc.) being measured.

In further detail, still referring to FIG. 1, the node 6 of the BAW transducer 3 is electrically connected to the first input node 12 of the input transducer 16 of hybrid SAW 14 via metal wire 10. The second node 19 of the input transducer 16 is connected to the signal ground 20. The output transducer of the SAW sensor 15 has two SAW propagation channels 31, 32 with two SAW transducers 17, 18. The SAW output transducers 17, 18 are electrically connected in parallel. The aperture W2, W3 of the output transducer is half of the aperture W1 of the input transducer 16. When SAW is excited by SAW transducer 16, the SAW propagating through channel 31 is received by SAW output transducer 18 and SAW propagating though channel 32 is received by SAW output transducer 17. The time delay for SAW propagation 16 to 17 is smaller than the time delay for SAW propagation from 16 to 18. The design of SAW transducer 16, 17, 18, are broadband response with center frequency same as the BAW transducer 2, 3, 4, 5. The output transducer of SAW sensor has three nodes, 13, 21 and 23. The node 21 is connected to the signal ground 22. The node 23 is connected to the first node 25 of the sensor load 26 via metal wire 24. The node 27 of the sensor load is connected to signal ground 28. The node 13 of the output SAW transducer is connected to the node 7 of the BAW transducer 4. The SAW absorber(s) 29, 30 are deposited to prevent reflection from the edge.

Figure 2:
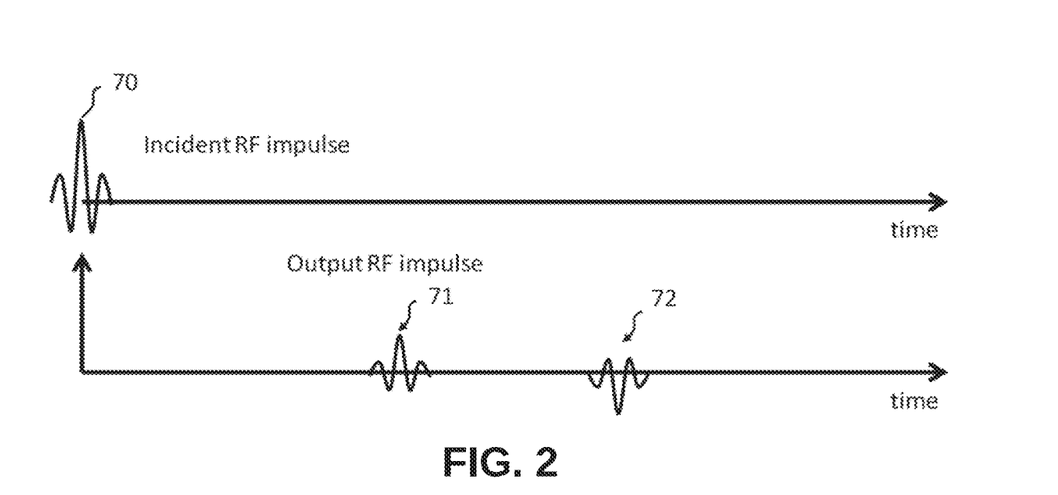
FIG. 2 is a graphical representation of the idealized impulses from the sensor system of FIG. 1.

Referring now to FIG. 2, when the incident RF impulse 70 enters the sensor embodiment shown in FIG. 1 from the interrogation circuit, the time domain output RF response received by the interrogation unit is a set of two impulses 71, 72. The design phase difference between impulse 71 and 72 is 180 degree.

Figure 3:
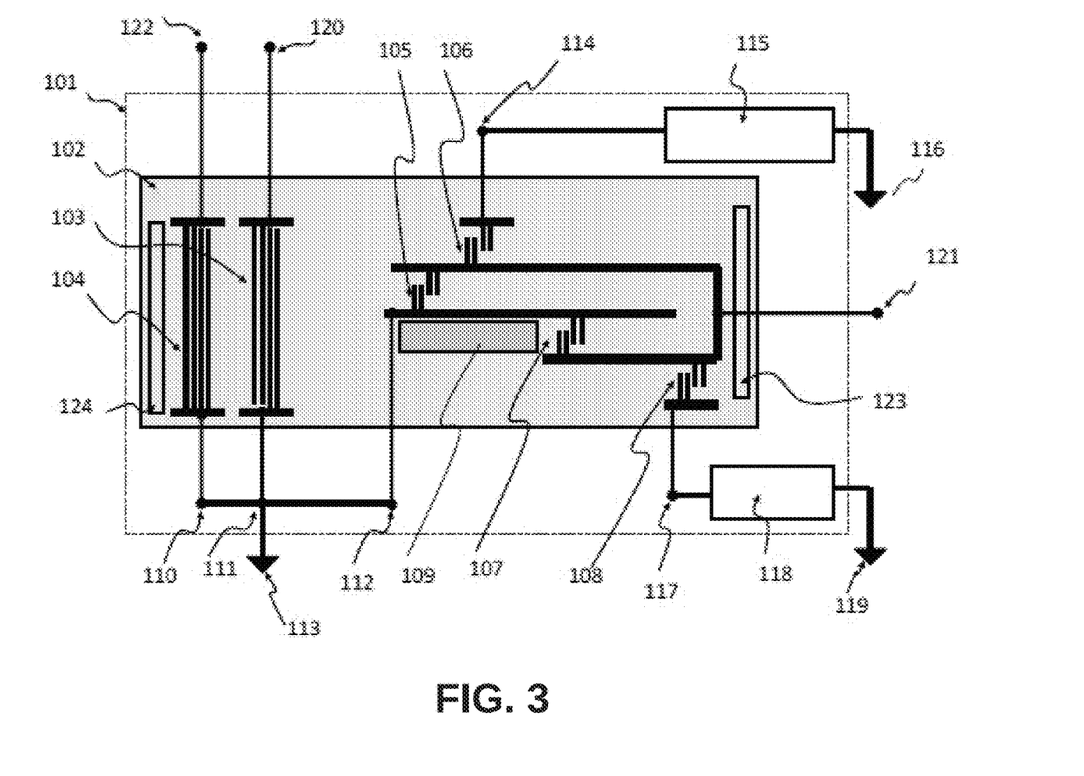
FIG. 3 is illustration of the hybrid SAW sensor of the present embodiment employing four channel SAW delay lines with self-reference generation.

FIG. 3 illustrates the alternate embodiment of a hybrid SAW sensor design 101 in accordance with an aspect of an embodiment. A SAW device 102 fabricated on a piezoelectric substrate has an input transducer 103 and output transducer 104, 105, 106, 107, 108. The input transducer 103 has first node 120 and second node 111. The node 111 is connected to the signal ground 113 and node 120 is connected to the electrical input signal which passes into the input of the sensor. The output transducer 104 generates reference signal and output transducer 105, 106, 107, 108 as illustrated is multichannel (multi delay line) output transducer generating time separated impulse signals and each impulse output is assigned for measuring environment attributes. The output transducers 104, 105, 106, 107, 108 have different time delays, with time delay for output transducer 104 being the least. The output transducer 104 has first node 122 and second node 110. The output transducer 105, 106, 107, 108 are electrically connected with four electrical nodes 112, 114, 117, 121. The node 110, 111, 112 are electrically connected to the signal ground 113. The node 122 and node 121 is electrical connected and are connected to the signal output. The node 114 is connected to the first end of the first sensor load 115 and the second end of the sensor load 115 is connected to signal ground 116. The node 117 is connected to the first end of the second sensor load 118 and the second end of the sensor load 118 is connected to signal ground 119. The $TiO_2$ thin film 109 is deposited to enable humidity sensing. All SAW transducers are made of split electrodes, apodized and equipped with dummy electrode to minimize reflection from each transducer. SAW absorber(s) 123, 124 are patterned near the edges of the SAW device to minimize edge reflection.

Figure 4:
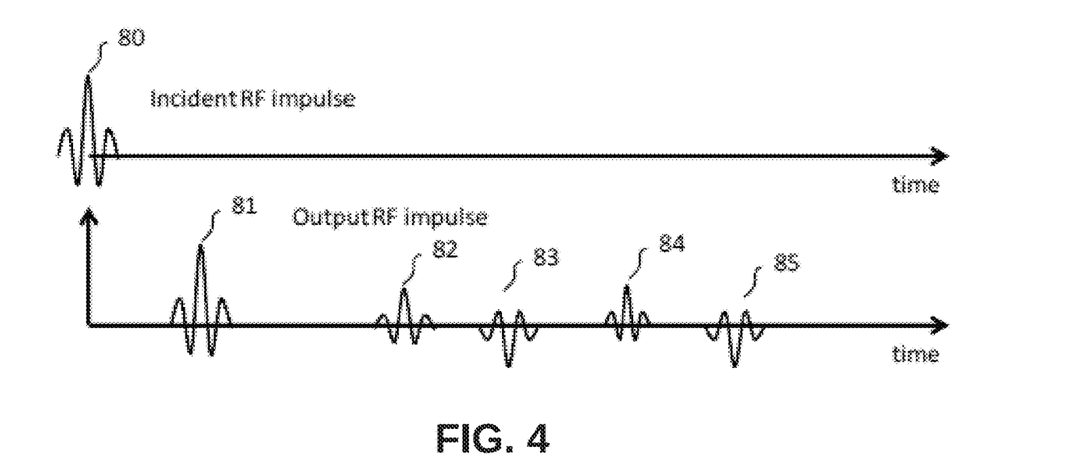
FIG. 4 is a graphical representation of the idealized impulses from the hybrid SAW sensor of FIG. 3.

Referring now to FIG. 4, when the incident RF impulse 80 enters the hybrid SAW sensor embodiment shown in FIG. 3, the time domain output RF response is set of five impulses 81, 82, 83, 84, 85. The impulse signal 81 is the reference signal pulse, which has the shortest time delay and highest amplitude in comparison to impulses 82, 83, 84, 85. The phase difference between impulse 82 and 84 is zero degree. The phase difference between impulse 83 and 85 is zero degree. The design phase difference between impulse 82 and 83 is 180 degree. Both the amplitudes and the time delays of impulses 82, 83, 84, 85 are measured with respect to reference impulse signal 81.

Figure 5:
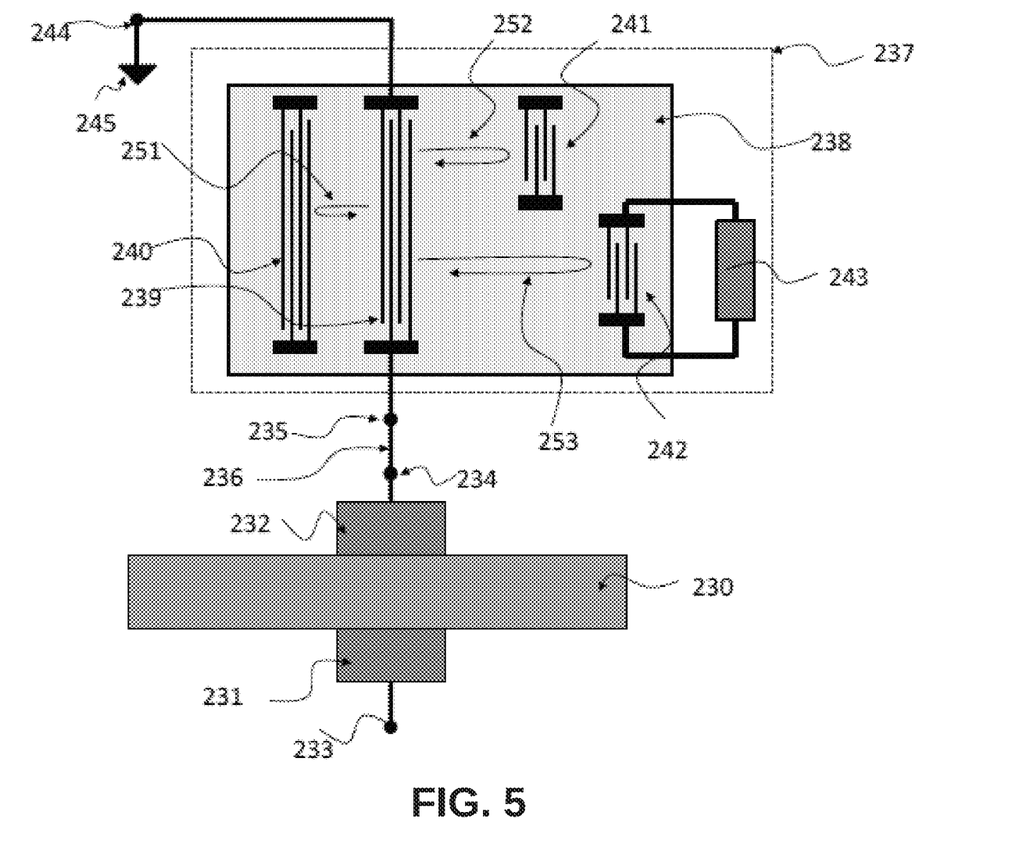
FIG. 5 is a perspective view of an alternate embodiment of a wireless sensor system according to the present invention.

Referring now to FIG. 5 is an illustration of alternate and equivalent embodiment of the wireless sensor with hybrid SAW sensor 237 and BAW transducer 231, 232. Pair (total two) of BAW transducers 231, 232 is mounted on the wall 230 of the enclosure as illustrated in FIG. 5. The BAW transducer design is a broadband frequency operation and the frequency response of BAW transducer 231, 232 has large overlap in frequency response. The node 233 of BAW transducer 231 is electrically connected to the interrogation circuit. The interrogation circuit triggers and receive signal from the wireless sensor though node 233. The hybrid SAW sensor 237 is an assembly of multichannel SAW sensor fabricated on piezoelectric substrate 238 and sensor load 243. The node 234 of the internal BAW transducer 232 is connected to the first input node 235 of the input/output SAW transducer 239 via metal wire 236. The second node 244 of the input/output SAW transducer 239 is electrically connected to signal ground. The input/output transducer 239 is made of split electrode. The SAW transducer 240, 241, 242 are SAW reflected transducers.

In further detail, still referring to FIG. 5, the aperture of SAW transducer 240 is equal to the input/output SAW transducer 239 and is patterned on one side of the input/output SAW transducer 239. The SAW impulse traveling toward the SAW transducer 240 follows the track 251. The SAW transducer 241, 242 are patterned second side of the input/output SAW transducer 239. The SAW transducer 241, 242 are arranged such that it divides the SAW propagation into two parallel tracks 252, 253. The time delays for tracks 251, 252, 253 are different, with track 251 being the smallest of all. The SAW transducer 242 is connected to the sensor load 43.

Figure 6:
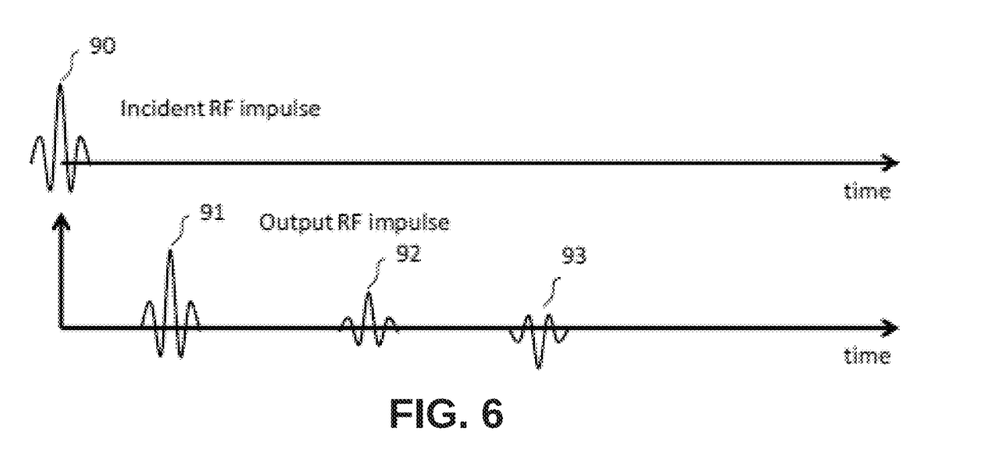
FIG. 6 is a graphical representation of the idealized impulses from the sensor system of FIG. 5.

Referring now to FIG. 6, when the incident RF impulse 90 enters the sensor embodiment shown in FIG. 5 from the interrogation circuit, the time domain output RF response received by the interrogation unit is a set of three impulses 91, 92 and 93. The design phase difference between impulse 92 and 93 is 180 degree. The impulse signal 91 is the reference signal pulse, which has the shortest time delay and highest amplitude in comparison to impulses 92 and 93. Both the amplitudes and the time delays of impulses 92, 93, are measured with respect to reference impulse signal 91.

Figure 7:
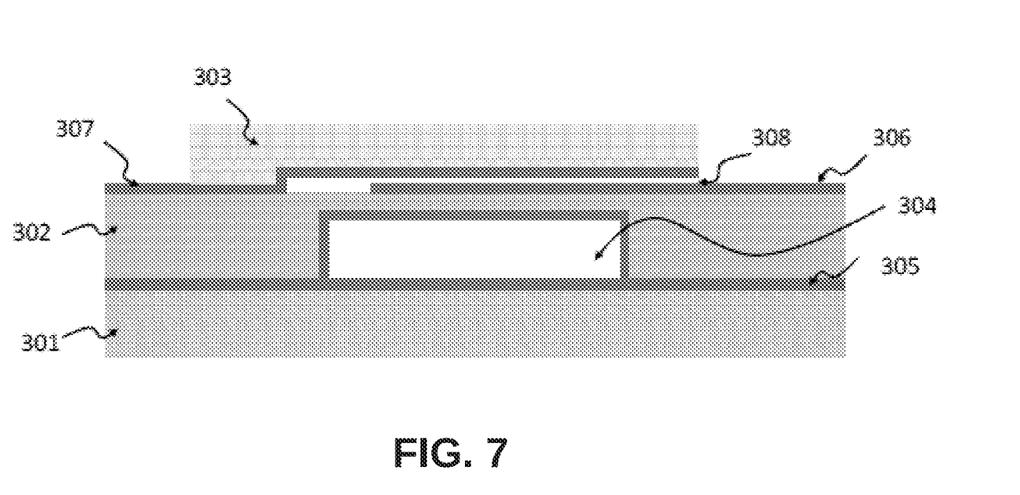
FIG. 7 is illustration of the pressure sensor load of the present embodiment.

Referring now to FIG. 7, it illustrates the pressure sensor load for sensor system illustrated in FIGS. 1, 3 and 5. The pressure sensor load is a pressure sensitive air capacitor and its capacitance changes with change in applied external pressure. It consists of a sealed cavity 304 formed by joining fused quartz substrates 301 and 302 using gold-gold pressure bonding layer 305. To create the quartz substrate 302 is etched, forming a diaphragm 309 whose displacement is dependent on the pressure after forming the cavity. The cavity 304 is coated inside with gold layer to ensure the gas entering or leaving the cavity does not facilitate at all conditions of operation in harsh conditions. The top of the diaphragm 309 has gold electrode 306 which moves as the diaphragm displaces it acts as the electrode for air capacitor. The third substrate 303 is etched and coated with gold layer 307 and is placed inverted on the diaphragm such that electrode 307 is not in contact with electrode 306 due to etched structure of substrate 303. The air capacitor 308 formed between electrode 307 and 306 is sensitive to pressure. The capacitance value decreases when environment pressure increases in comparison to ambient pressure and vice versa. For example, the capacitance value increase when the environment pressure is lower than the ambient pressure. The electrode 307 is connected to signal ground and electrode 306 is connected to the SAW sensor for pressure sensing. The pressure sensitive load illustrated in FIG. 7 allows the pressure sensing from vacuum to high pressure.

Figure 8:
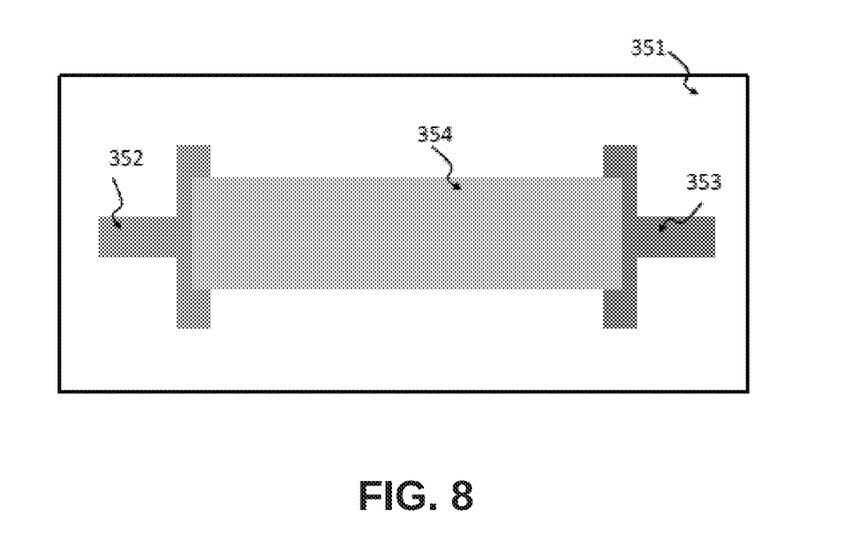
FIG. 8 is illustration of the hydrogen gas sensor load of the present embodiment.

Referring now to FIG. 8, it illustrates the hydrogen gas sensor load for sensor system illustrated in FIGS. 1, 3 and 5. The hydrogen gas sensor load is a palladium (Pd) resistor and its resistance changes with change in concentration of hydrogen gas in the environment. It consists of two electrodes 352 and 353 on fused quartz substrate 351. The electrodes are formed using gold thin film with Chromium to increase the gold adhesion. The gold electrode can further be used to bond the hydrogen gas sensor load to the sensor using gold bolding. The electrode 352 and 353 is connected by the Pd thin film 354 whose resistance changes as the hydrogen concentration vary in the environment. The electrode 352 is connected to the SAW sensor and the 353 is connected to the signal ground.

The invention provides an improved sensor system for use in high temperature, high pressure and in radiation environments. In this invention, a surface acoustic wave (SAW) sensor is synergically combined with the ultrasonic bulk acoustic wave (BAW) transducers to support the excitation and reception of sensor signal through, but not limited to, a thick metal wall made of stainless steel. The SAW sensor and BAW transducer(s) to be placed inside the inaccessible location are designed to survive the harsh environment such as high temperature, corrosion and high radiations. The excitation and reception of the signal from the SAW sensor is achieved via acoustic channel using ultrasonic transducers, one converting electrical signal to acoustic signal which propagates through the thick metal wall and second converting back the acoustic signal into electrical signal.

While the invention has been described with a certain degree of particularity, it is manifest that many changes may be made in detail of construction and the arrangement of components without departing from the spirit and scope of this disclosure. The present disclosure is to be considered as an exemplification of the principles of the invention and is not intended to limit the invention to the specific embodiments illustrated herein by the figures or description above.

What is claimed is:

1. A sensor system, comprising:
    a hybrid surface acoustic wave (SAW) sensor comprising a SAW sensor fabricated on a piezoelectric substrate and a set of sensor loads,
    wherein the SAW sensor comprises a plurality of SAW transducers configured for:
        receiving an input electrical signal;
        generating an output SAW based on the input electrical signal; and
        generating a plurality of time separated output electrical signals corresponding to a plurality of environmental attributes, wherein the plurality of time separated output electrical signals are generated based on a plurality of time delays in reception of the output SAW, and wherein a set of the plurality of time separated output electrical signals are generated based on the set of sensor loads, and
    a set of ultrasonic transducers configured for providing the input electrical signal upon receiving trigger from an interrogation circuit, and for receiving the plurality of time separated output electrical signals and providing the same to a receiver of the interrogation circuit.
2. The sensor system of claim 1, wherein the plurality of SAW transducers comprises:
    an input SAW transducer configured for receiving the input electrical signal and generating the output SAW; and
    a multi-channel output SAW transducer configured for generating the plurality of time separated output electrical signals, wherein the multi-channel output SAW transducer comprises a plurality of output SAW transducers electrically coupled to each other and configured for receiving the output SAW at the plurality of time delays, and wherein a set of the plurality of output SAW transducers are coupled to the set of sensor loads.
3. The sensor system of claim 2, wherein the multi-channel output SAW transducer is a two-channel output SAW transducer comprising a first output SAW transducer electrically coupled to a second output SAW transducer in parallel.
4. The sensor system of claim 3, wherein an aperture of each of the first output SAW transducer and the second output SAW transducer is about half of an aperture of the input SAW transducer.
5. The sensor system of claim 1, wherein the plurality of SAW transducers comprises:
    an input/output SAW transducer configured for receiving the input electrical signal and generating the output SAW and for receiving a plurality of reflected SAWs and generating the plurality of time separated output electrical signals; and
    a plurality of reflected SAW transducers configured for receiving the output SAW and generating the plurality of reflected SAWs at the plurality of time delays, and wherein a set of the plurality of reflected SAW transducers are coupled to the set of sensor loads.
6. The sensor system of claim 5, wherein one of the plurality of reflected SAW transducers is patterned on one side of the input/output SAW transducer, while remaining of the plurality of reflected SAW transducers are patterned on other side of the input/output SAW transducer.
7. The sensor system of claim 6, wherein an aperture of the one of the plurality of reflected SAW transducer is about same size as an aperture of the input/output SAW transducer.
8. The sensor system of claim 1, further comprising a Titanium Dioxide thin film disposed with the SAW sensor and positioned near one of the plurality of SAW transducers.
9. The sensor system of claim 1, wherein each of the plurality of SAW transducers and the set of ultrasonic transducers are broadband frequency transducer with about same center frequency.
10. The sensor system of claim 1, wherein the set of ultrasonic transducers comprise an inaccessible ultrasonic transducer capable of being mounted on a wall within an enclosure and an accessible ultrasonic transducer capable of being mounted on the wall outside the enclosure.
11. The sensor system of claim 1, wherein the inaccessible ultrasonic transducer and the accessible ultrasonic transducer are positioned to maximize an acoustic signal transmission between them.
12. The sensor system of claim 1, wherein the SAW sensor further comprises a plurality of SAW absorbers disposed near a plurality of edges within the SAW sensor and configured for eliminating or minimizing edge reflections of a SAW.
13. The sensor system of claim 1, wherein each of the plurality of SAW transducers comprises anodized split electrodes and dummy electrodes, wherein the dummy electrodes are configured for eliminating or minimizing reflections of SAW from other transducers.

14. The sensor system of claim 1, wherein the set of sensor loads comprises at least one of a pressure sensor load and a gas sensor load.

15. The sensor system of claim 1, wherein each of the plurality of SAW transducers comprises anodized split electrodes and dummy electrodes, wherein the dummy electrodes are configured for eliminating or minimizing reflections of SAW from other transducers.

16. A SAW sensor, comprising:
a plurality of SAW transducers fabricated on a piezoelectric substrate, the plurality of SAW transducers configured for:
receiving an input electrical signal;
generating an output SAW based on the input electrical signal; and
generating a plurality of time separated output electrical signals corresponding to a plurality of environmental attributes, wherein the plurality of time separated output electrical signals are generated based on a plurality of time delays in reception of the output SAW, and wherein a set of the plurality of time separated output electrical signals are generated based on a set of sensor loads, and
wherein the multi-channel output SAW transducer is a two-channel output SAW transducer comprising a first output SAW transducer electrically coupled to a second output SAW transducer in parallel, wherein an aperture of each of the first output SAW transducer and the second output SAW transducer is about half of an aperture of the input SAW transducer.

17. The SAW sensor of claim 16, wherein the plurality of SAW transducers comprises:
an input SAW transducer configured for receiving the input electrical signal and generating the output SAW; and
a multi-channel output SAW transducer configured for generating the plurality of time separated output electrical signals, wherein the multi-channel output SAW transducer comprises a plurality of output SAW transducers electrically coupled to each other and configured for receiving the output SAW at the plurality of time delays.

18. The SAW sensor of claim 16, wherein the plurality of SAW transducers comprises:
an input/output SAW transducer configured for receiving the input electrical signal and generating the output SAW and for receiving a plurality of reflected SAWs and generating the plurality of time separated output electrical signals; and
a plurality of reflected SAW transducers configured for receiving the output SAW and generating plurality of reflected SAWs at the plurality of time delays, wherein one of the plurality of reflected SAW transducer is patterned on one side of the input/output SAW transducer, while a remaining of the plurality of reflected SAW transducers are patterned on other side of the input/output SAW transducer.

* * * * *

UNITED STATES PATENT AND TRADEMARK OFFICE
CERTIFICATE OF CORRECTION

| | | |
|---|---|---|
| PATENT NO. | : 11,509,285 B2 | Page 1 of 1 |
| APPLICATION NO. | : 16/528579 | |
| DATED | : November 22, 2022 | |
| INVENTOR(S) | : Dan Xiang and Uday Singh | |

It is certified that error appears in the above-identified patent and that said Letters Patent is hereby corrected as shown below:

In the Specification

Column 1, Line 10 insert:
--This Invention was made with U.S. Government support under Contract No. DOE, # DE-SC0013745 awarded by the Department of Energy. The Government has certain rights in this invention.--

Signed and Sealed this
Twenty-second Day of October, 2024

Katherine Kelly Vidal
*Director of the United States Patent and Trademark Office*